(12) United States Patent
Xia et al.

(10) Patent No.: US 8,578,241 B2
(45) Date of Patent: Nov. 5, 2013

(54) SYSTEMS AND METHODS FOR PARITY SHARING DATA PROCESSING

(75) Inventors: Haitao Xia, San Jose, CA (US);
Shaohua Yang, Santa Clara, CA (US);
Johnson Yen, Fremont, CA (US)

(73) Assignee: LSI Corporation, San Jose, CA (US)

( * ) Notice: Subject to any disclaimer, the term of this patent is extended or adjusted under 35 U.S.C. 154(b) by 155 days.

(21) Appl. No.: 13/269,832

(22) Filed: Oct. 10, 2011

(65) Prior Publication Data
US 2013/0091397 A1   Apr. 11, 2013

(51) Int. Cl.
*H03M 13/00* (2006.01)

(52) U.S. Cl.
USPC ............................ 714/758; 714/752; 714/755

(58) Field of Classification Search
USPC .................................................. 714/752, 758
See application file for complete search history.

(56) References Cited

U.S. PATENT DOCUMENTS

| | | |
|---|---|---|
| 5,278,703 A | 1/1994 | Rub |
| 5,278,846 A | 1/1994 | Okayama et al. |
| 5,325,402 A | 6/1994 | Ushirokawa |
| 5,392,299 A | 2/1995 | Rhines et al. |
| 5,471,500 A | 11/1995 | Blaker et al. |
| 5,513,192 A | 4/1996 | Janku et al. |
| 5,523,903 A | 6/1996 | Hetzler |
| 5,550,870 A | 8/1996 | Blaker et al. |
| 5,612,964 A | 3/1997 | Haraszti |
| 5,701,314 A | 12/1997 | Armstrong et al. |
| 5,710,784 A | 1/1998 | Kindred et al. |
| 5,712,861 A | 1/1998 | Inoue et al. |
| 5,717,706 A | 2/1998 | Ikeda |
| 5,768,044 A | 6/1998 | Hetzler |
| 5,802,118 A | 9/1998 | Bliss et al. |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |

(Continued)

FOREIGN PATENT DOCUMENTS

| | | |
|---|---|---|
| EP | 0522578 | 1/1993 |
| EP | 0631277 | 12/1994 |

(Continued)

OTHER PUBLICATIONS

U.S. Appl. No. 11/461,026, filed Jul. 31, 2006, Tan, Weijun.
U.S. Appl. No. 13/088,119, filed Apr. 15, 2011, Zhang, et al.
U.S. Appl. No. 13/088,146, filed Apr. 15, 2011, Li, et al.
U.S. Appl. No. 13/088,178, filed Apr. 15, 2011, Sun, et al.
U.S. Appl. No. 13/126,748, filed Apr. 28, 2011, Tan.
U.S. Appl. No. 13/167,764, filed Jun. 24, 2011, Li, Zongwang, et al.

(Continued)

*Primary Examiner* — Sam Rizk
(74) *Attorney, Agent, or Firm* — Hamilton DeSanctis & Cha

(57) ABSTRACT

Various embodiments of the present invention provide systems and methods for data processing. For example, a data processing system is disclosed that includes: a data detector circuit, a low density parity check data decoder circuit, and a processing circuit. The processing circuit is operable to: reconstitute a second encoded sub-codeword from a combination of data including the first encoded sub-codeword and the composite sub-codeword; and correct an error in one of the first encoded sub-codeword and the second encoded sub-codeword based at least in part on a combination of the first encoded sub-codeword, the second encoded sub-codeword, and the composite sub-codeword.

20 Claims, 5 Drawing Sheets

(56) References Cited

U.S. PATENT DOCUMENTS

| | | |
|---|---|---|
| 6,041,432 A | 3/2000 | Ikeda |
| 6,065,149 A | 5/2000 | Yamanaka |
| 6,097,764 A | 8/2000 | McCallister et al. |
| 6,145,110 A | 11/2000 | Khayrallah |
| 6,216,249 B1 | 4/2001 | Bliss et al. |
| 6,216,251 B1 | 4/2001 | McGinn |
| 6,229,467 B1 | 5/2001 | Eklund et al. |
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,381,726 B1 | 4/2002 | Weng |
| 6,438,717 B1 | 8/2002 | Butler et al. |
| 6,473,878 B1 | 10/2002 | Wei |
| 6,476,989 B1 | 11/2002 | Chainer et al. |
| 6,584,595 B2 | 6/2003 | Cypher |
| 6,625,775 B1 | 9/2003 | Kim |
| 6,657,803 B1 | 12/2003 | Ling et al. |
| 6,671,404 B1 | 12/2003 | Kawatani et al. |
| 6,748,034 B2 | 6/2004 | Hattori et al. |
| 6,757,862 B1 | 6/2004 | Marianetti, II |
| 6,785,863 B2 | 8/2004 | Blankenship et al. |
| 6,788,654 B1 | 9/2004 | Hashimoto et al. |
| 6,810,502 B2 | 10/2004 | Eidson |
| 6,980,382 B2 | 12/2005 | Hirano et al. |
| 6,986,098 B2 | 1/2006 | Poeppelman |
| 7,010,051 B2 | 3/2006 | Murayama et al. |
| 7,047,474 B2 | 5/2006 | Rhee et al. |
| 7,058,873 B2 | 6/2006 | Song et al. |
| 7,073,118 B2 | 7/2006 | Greeberg et al. |
| 7,093,179 B2 | 8/2006 | Shea |
| 7,113,356 B1 | 9/2006 | Wu |
| 7,136,244 B1 | 11/2006 | Rothbert |
| 7,173,783 B1 | 2/2007 | McEwen et al. |
| 7,184,486 B1 | 2/2007 | Wu et al. |
| 7,191,378 B2 | 3/2007 | Eroz et al. |
| 7,203,015 B2 | 4/2007 | Sakai et al. |
| 7,203,887 B2 | 4/2007 | Eroz et al. |
| 7,236,757 B2 | 6/2007 | Raghaven et al. |
| 7,257,764 B2 | 8/2007 | Suzuki et al. |
| 7,310,768 B2 | 12/2007 | Eidson et al. |
| 7,313,750 B1 | 12/2007 | Feng et al. |
| 7,370,258 B2 | 5/2008 | Iancu et al. |
| 7,403,752 B2 | 7/2008 | Raghaven et al. |
| 7,418,651 B2 | 8/2008 | Luby |
| 7,430,256 B2 | 9/2008 | Zhidkov |
| 7,502,189 B2 | 3/2009 | Sawaguchi et al. |
| 7,505,537 B1 | 3/2009 | Sutardja |
| 7,523,375 B2 | 4/2009 | Spencer |
| 7,559,008 B1 * | 7/2009 | Patapoutian ............ 714/800 |
| 7,587,657 B2 | 9/2009 | Haratsch |
| 7,590,168 B2 | 9/2009 | Raghavan et al. |
| 7,590,927 B1 | 9/2009 | Shih et al. |
| 7,702,989 B2 | 4/2010 | Graef et al. |
| 7,712,008 B2 | 5/2010 | Song et al. |
| 7,738,201 B2 | 6/2010 | Jin et al. |
| 7,752,523 B1 | 7/2010 | Chaichanavong |
| 7,801,200 B2 | 9/2010 | Tan |
| 7,802,163 B2 | 9/2010 | Tan |
| 8,117,515 B2 * | 2/2012 | Yang ............... 714/755 |
| 2003/0063405 A1 | 4/2003 | Jin et al. |
| 2003/0081693 A1 | 5/2003 | Raghavan et al. |
| 2003/0087634 A1 | 5/2003 | Raghavan et al. |
| 2003/0112896 A1 | 6/2003 | Raghavan et al. |
| 2003/0134607 A1 | 7/2003 | Raghavan et al. |
| 2004/0027947 A1 | 2/2004 | Asano et al. |
| 2004/0071206 A1 | 4/2004 | Takatsu |
| 2004/0098659 A1 | 5/2004 | Bjerke et al. |
| 2005/0007840 A1 | 1/2005 | Watanabe et al. |
| 2005/0010855 A1 | 1/2005 | Lusky |
| 2005/0078399 A1 | 4/2005 | Fung et al. |
| 2005/0111540 A1 | 5/2005 | Modrie et al. |
| 2005/0157780 A1 | 7/2005 | Werner et al. |
| 2005/0195749 A1 | 9/2005 | Elmasry et al. |
| 2005/0216819 A1 | 9/2005 | Chugg et al. |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0123285 A1 | 6/2006 | De Araujo et al. |
| 2006/0140311 A1 | 6/2006 | Ashley et al. |
| 2006/0168493 A1 | 7/2006 | Song et al. |
| 2006/0195772 A1 | 8/2006 | Graef et al. |
| 2006/0210002 A1 | 9/2006 | Yang et al. |
| 2006/0248435 A1 | 11/2006 | Haratsch |
| 2006/0256670 A1 | 11/2006 | Park et al. |
| 2007/0011569 A1 | 1/2007 | Casado et al. |
| 2007/0047121 A1 | 3/2007 | Eleftheriou et al. |
| 2007/0047635 A1 | 3/2007 | Stojanovic et al. |
| 2007/0110200 A1 | 5/2007 | Mergen et al. |
| 2007/0230407 A1 | 10/2007 | Petrie et al. |
| 2007/0286270 A1 | 12/2007 | Huang et al. |
| 2008/0049825 A1 | 2/2008 | Chen et al. |
| 2008/0055122 A1 | 3/2008 | Tan |
| 2008/0065970 A1 | 3/2008 | Tan |
| 2008/0069373 A1 | 3/2008 | Jiang et al. |
| 2008/0168330 A1 | 7/2008 | Graef et al. |
| 2008/0276156 A1 | 11/2008 | Gunnam |
| 2008/0301521 A1 | 12/2008 | Gunnam |
| 2009/0185643 A1 | 7/2009 | Fitzpatrick |
| 2009/0199071 A1 | 8/2009 | Graef |
| 2009/0235116 A1 | 9/2009 | Tan et al. |
| 2009/0235146 A1 | 9/2009 | Tan et al. |
| 2009/0259915 A1 | 10/2009 | Livshitz et al. |
| 2009/0273492 A1 | 11/2009 | Yang et al. |
| 2009/0274247 A1 | 11/2009 | Galbraith et al. |
| 2010/0002795 A1 | 1/2010 | Raghaven et al. |
| 2010/0042877 A1 | 2/2010 | Tan |
| 2010/0042890 A1 | 2/2010 | Gunnam |
| 2010/0050043 A1 | 2/2010 | Savin |
| 2010/0061492 A1 | 3/2010 | Noeldner |
| 2010/0070837 A1 | 3/2010 | Xu et al. |
| 2010/0164764 A1 | 7/2010 | Nayak |
| 2010/0174965 A1 * | 7/2010 | Sutskover et al. ............ 714/752 |
| 2010/0185914 A1 | 7/2010 | Tan et al. |
| 2010/0101578 A1 | 9/2010 | Cha et al. |
| 2011/0075525 A1 | 3/2011 | Kimura |
| 2011/0075569 A1 | 3/2011 | Marrow et al. |
| 2011/0080211 A1 | 4/2011 | Yang et al. |
| 2011/0167246 A1 | 7/2011 | Yang et al. |

FOREIGN PATENT DOCUMENTS

| | | |
|---|---|---|
| EP | 1814108 | 8/2007 |
| EP | 2323263 | 5/2011 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | WO 2010/101578 | 9/2010 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,317, filed Sep. 21, 2010, Xia, et al.
U.S. Appl. No. 12/887,330, filed Sep. 21, 2010, Zhang, et al.
U.S. Appl. No. 12/887,369, filed Sep. 21, 2010, Liu, et al.
U.S. Appl. No. 12/901,816, filed Oct. 11, 2010, Li, et al.
U.S. Appl. No. 12/901,742, filed Oct. 11, 2010, Yang.
U.S. Appl. No. 12/917,756, filed Nov. 2, 2010, Miladinovic, et al.
U.S. Appl. No. 12/947,931, filed Nov. 17, 2010, Yang, Shaohua.
U.S. Appl. No. 12/947,947, filed Nov. 17, 2010, Ivkovic, et al.
U.S. Appl. No. 12/972,942, filed Dec. 20, 2010, Liao, et al.
U.S. Appl. No. 12/992,948, filed Nov. 16, 2010, Yang, et al.
U.S. Appl. No. 13/021,814, filed Feb. 7, 2011, Jin, Ming, et al.
U.S. Appl. No. 13/031,818, filed Feb. 22, 2011, Xu, Changyou, et al.
U.S. Appl. No. 13/050,129, filed Mar. 17, 2011, Tan, et al.
U.S. Appl. No. 13/050,765, filed Mar. 17, 2011, Yang, et al.

(56) References Cited

OTHER PUBLICATIONS

U.S. Appl. No. 13/167,771, filed Jun. 24, 2011, Li, Zongwang, et al.
U.S. Appl. No. 13/167,775, filed Jun. 24, 2011, Li, Zongwang.
U.S. Appl. No. 13/186,146, filed Jul. 19, 2011, Mathew, et al.
U.S. Appl. No. 13/186,213, filed Jul. 19, 2011, Mathew, et al.
U.S. Appl. No. 13/186,234, filed Jul. 19, 2011, Xia, Haitao, et al.
U.S. Appl. No. 13/186,251, filed Jul. 19, 2011, Xia, Haitao, et al.
U.S. Appl. No. 13/186,174, filed Jul. 19, 2011, Mathew, et al.
U.S. Appl. No. 13/186,197, filed Jul. 19, 2011, Mathew, George et al.
U.S. Appl. No. 13/213,751, filed Aug. 19, 2011, Zhang, Fan, et al.
U.S. Appl. No. 13/213,808, filed Aug. 19, 2011, Jin, Ming.
U.S. Appl. No. 13/220,142, filed Aug. 29, 2011, Chang, Wu, et al.
U.S. Appl. No. 13/227,538, filed Sep. 8, 2011, Yang, Shaohua, et al.
U.S. Appl. No. 13/227,544, filed Sep. 8, 2011, Yang, Shaohua, et al.
U.S. Appl. No. 13/239,683, filed Sep. 22, 2011, Xu, Changyou.
U.S. Appl. No. 13/239,719, filed Sep. 22, 2011, Xia, Haitao, et al.
U.S. Appl. No. 13/251,342, filed Oct. 2, 2011, Xia, Haitao, et al.
U.S. Appl. No. 13/269,832, filed Oct. 10, 2011, Xia, Haitao, et al.
U.S. Appl. No. 13/269,852, filed Oct. 10, 2011, Xia, Haitao, et al.
U.S. Appl. No. 13/284,819, filed Oct. 28, 2011, Tan, Weijun, et al.
U.S. Appl. No. 13/284,730, filed Oct. 28, 2011, Zhang, Fan, et al.
U.S. Appl. No. 13/284,754, filed Oct. 28, 2011, Zhang, Fan, et al.
U.S. Appl. No. 13/284,767, filed Oct. 28, 2011, Zhang, Fan, et al.
U.S. Appl. No. 13/284,826, filed Oct. 28, 2011, Tan, Weijun, et al.
U.S. Appl. No. 13/295,150, filed Nov. 14, 2011, Li, Zongwang, et al.
U.S. Appl. No. 13/295,160, filed Nov. 14, 2011, Li, Zongwang, et al.
U.S. Appl. No. 13/251,340, filed Oct. 3, 2011, Xia, Haitao, et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low-denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System Architectures: Synergies with Solid-State Disks" Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Lin et al "An efficient VLSI Architecture for non binary LDPC decoders"—IEEE Transaction on Circuits and Systems II vol. 57, Issue 1 (Jan. 2010) pp. 51-55.
Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center Ny, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. in COFDM System" IEEE Trans. on Consumer Elect., IEEE Service Center, NY, NY vol. 45, No. 3 Sep. 1999.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matirx in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. on Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Iterative MAX-LOG-MAP and LDPC Detector/Decoder Hardware Implementation for Magnetic Read Channel", SRC TECHRON, pp. 1-4, Oct. 2005.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "VLSI Architecture of LDPC Based Signal Detection and Coding System for Magnetic Recording Channel", Thesis, RPI, Troy, NY, pp. 1-95, May 2006.

\* cited by examiner

SYSTEMS AND METHODS FOR PARITY SHARING DATA PROCESSING

BACKGROUND OF THE INVENTION

The present inventions are related to systems and methods for data processing, and more particularly to systems and methods for data decoding.

Various storage systems include data processing circuitry implemented with a data decoding circuit. In some cases, the data decoding circuit operates on a very large codeword that includes a number of parity bits. It is an advantage to use increasingly large codewords to achieve increased data processing performance. However, such large codewords require large and complex data decoding circuits. Such large and complex data decoding circuits require significant die area and power. One approach to dealing with this situation is to make a very large codeword out of a number of smaller codewords that are concatenated together. Such smaller codewords allow for reducing the size and power required by the data decoding circuit, but come with a corresponding reduction in processing performance.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for data decoding.

Various embodiments of the present invention provide data processing systems that include a data detector circuit, a data decoder circuit, and a processing circuit. The data detector circuit is operable to apply a data detection algorithm to a data set to yield a detected output. The data set includes at least a first encoded sub-codeword and a composite sub-codeword. The data decoder circuit is operable to apply a data decode algorithm to the encoded sub-codeword to yield a first decoded output, and to apply the data decode algorithm to the composite sub-codeword to yield a second decoded output. The processing circuit is operable to: reconstitute a second encoded sub-codeword from a combination of data including the first encoded sub-codeword and the composite sub-codeword; and correct an error in one of the first encoded sub-codeword and the second encoded sub-codeword based at least in part on a combination of the first encoded sub-codeword, the second encoded sub-codeword, and the composite sub-codeword.

In some instances of the aforementioned embodiments, the data processing system is implemented as part of a storage device or a receiving device. In some cases, the storage device is a disk based storage device. In other cases, the storage device is a solid state storage device. In various instances of the aforementioned embodiments, the data processing system is implemented as part of an integrated circuit. In one or more instances of the aforementioned embodiments the data detection algorithm is a maximum a posteriori data detection algorithm. In other instances, the data detection algorithm is a Viterbi detection algorithm. In some instances of the aforementioned embodiments, the data decode algorithm is a low density parity check algorithm.

In some instances of the aforementioned embodiments, the composite codeword is a mathematical combination of at least the first encoded sub-codeword and the second encoded sub-codeword. In particular instances of the aforementioned embodiments, the the composite codeword is a mod 2 combination of at least the first encoded sub-codeword and the second encoded sub-codeword. In some cases, reconstituting the second encoded sub-codeword from the combination of data including the first encoded sub-codeword and the composite sub-codeword includes reversing the mathematical combination of at least the first encoded sub-codeword and the second encoded sub-codeword. In particular cases, correcting the error in one of the first encoded sub-codeword and the second encoded sub-codeword based at least in part on a combination of the first encoded sub-codeword, the second encoded sub-codeword, and the composite sub-codeword includes modifying an element of one of the first encoded sub-codeword and the second encoded sub-codeword such that the mathematical combination of at least the first encoded sub-codeword and the second encoded sub-codeword yields a correct mathematical relationship. In some cases, the data decoder circuit includes: a first decode circuit operable to apply the data decode algorithm to the encoded sub-codeword to yield the first decoded output, and a second decode circuit operable to apply the data decode algorithm to the composite sub-codeword to yield the second decoded output. In other cases, the data decoder circuit includes a decode circuit that is operable to apply the data decode algorithm to the encoded sub-codeword to yield the first decoded output during a first time period, and apply the data decode algorithm to the composite sub-codeword to yield the second decoded output during a second time period.

Other embodiments of the present invention provide methods for data processing. The methods include receiving a data set that includes at least a first encoded sub-codeword and a composite sub-codeword. A data detection algorithm is performed by a data detector circuit on the data set to yield a detected output. A data decode algorithm is performed on a second data set derived from the detected output to yield a first decoded output corresponding to the first encoded sub-codeword, and the data decode algorithm is performed on a third data set derived from the detected output to yield a second decoded output corresponding to the composite sub-codeword. A second encoded sub-codeword is reconstituted from a combination of data including the second decoded output and the first decoded output, and an error in one of the first decoded output and the second decoded output is corrected based at least in part on a combination of the first encoded sub-codeword, the second encoded sub-codeword, and the composite sub-codeword. In some cases, the composite codeword is a mathematical combination of at least the first encoded sub-codeword and the second encoded sub-codeword. In various cases, reconstituting the second encoded sub-codeword from the combination of data including the second decoded output and the first decoded output includes reversing the mathematical combination of at least the first encoded sub-codeword and the second encoded sub-codeword. In some such cases, correcting the error in one of the first decoded output and the second decoded output based at least in part on the combination of the first encoded sub-codeword, the second encoded sub-codeword, and the composite sub-codeword includes modifying an element of one of the first encoded sub-codeword and the second encoded sub-codeword such that the mathematical combination of at least the first encoded sub-codeword and the second encoded sub-codeword yields a correct mathematical relationship.

Various embodiments of the present invention provide low density parity check encoding systems. Such encoding systems include: a low density parity check encoder circuit, and a combining circuit. The low density parity check encoder circuit is operable to encode a first data set to yield a first low density parity check encoded sub-codeword, and to encode a second data set to yield a second low density parity check encoded sub-codeword. The combining circuit is operable to: generate a composite low density parity check sub-codeword by mathematically combining at least the first low density parity check encoded sub-codeword and the second low density parity check encoded sub-codeword; and combine at least the first low density parity check encoded sub-codeword and the composite low density parity check sub-codeword into an overall codeword.

In some instances of the aforementioned embodiments, generating the composite low density parity check sub-codeword includes performing a mod 2 mathematical process on a bit by bit basis of the first low density parity check encoded sub-codeword and the second low density parity check encoded sub-codeword to yield the composite low density parity check sub-codeword. In various instances of the aforementioned embodiments, mathematically combining at least the first low density parity check encoded sub-codeword and the second low density parity check encoded sub-codeword to yields a valid low density parity check codeword. In one or more instances of the aforementioned embodiments, the composite low density parity check sub-codeword, the first low density parity check encoded sub-codeword, and the second low density parity check encoded sub-codeword are all decodable using the same low density parity check decoding algorithm.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for data decoding.

Various embodiments of the present invention provide systems and methods for data processing. Such systems and methods rely on an overall codeword that shares parity between a number of sub-codewords. Such an approach allows for enhanced data processing performance where the error correction power of the overall codeword is greater than any one sub-codeword, while allowing for reduced circuit size and power. In some embodiments of the present invention, shared parity codewords are created by aggregating a number of sub-codewords, and encoding one of the number of sub-codewords to include parity that represents processing across multiple sub-codewords. Where data decoding of one or more sub-codewords fails to converge, the sub-codeword incorporating parity from across the sub-codewords may be used to regenerate the otherwise non-converging sub-codeword. In some cases, two or more sub-code-words may be processed by a common data decoder circuit in a time sharing approach that further reduces circuit size.

Figure 1:
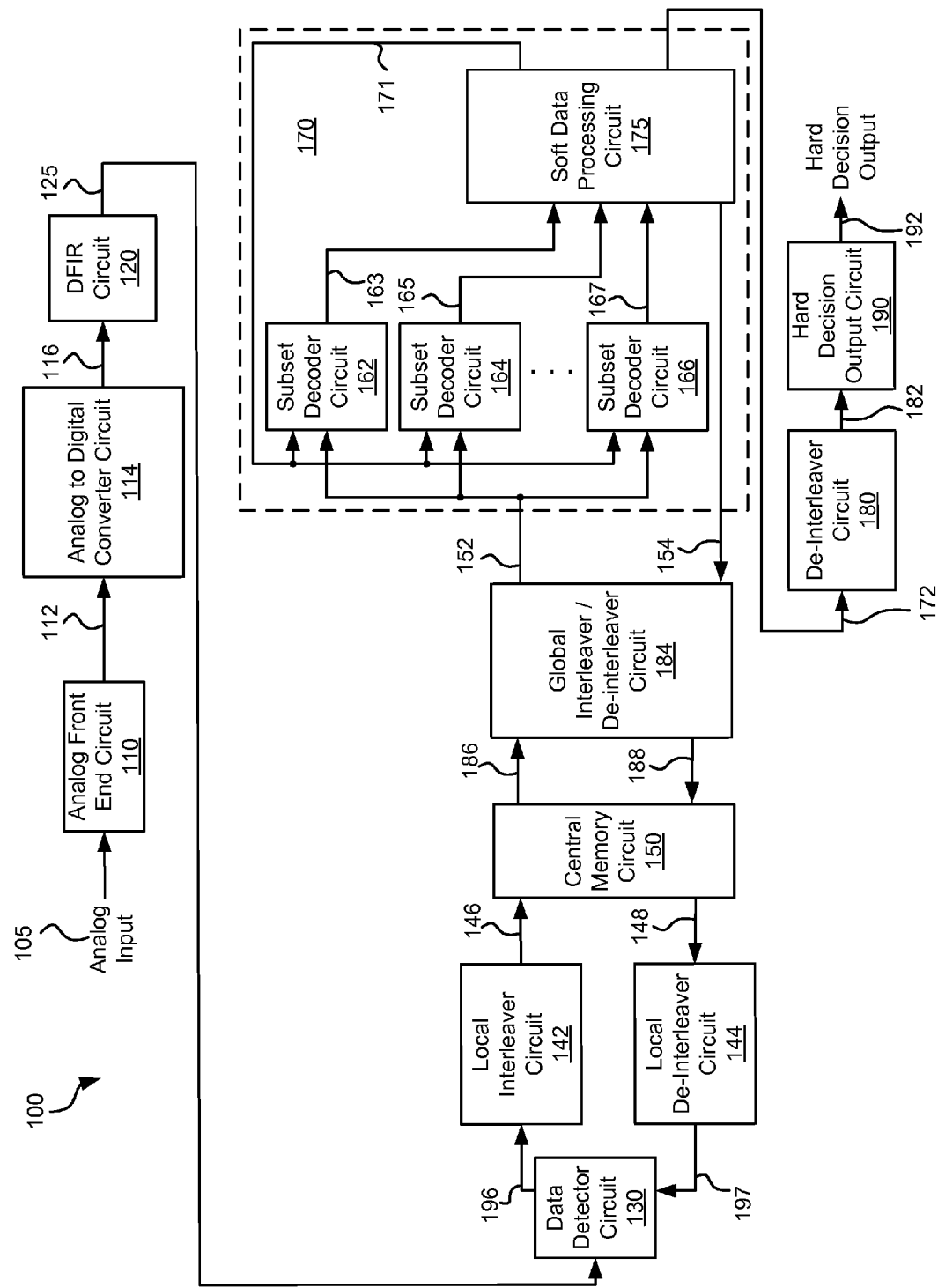
FIG. 1 shows a data processing circuit including a shared parity data decoding circuit in accordance with one or more embodiments of the present invention.

Turning to FIG. 1, a data processing circuit 100 is shown that includes a shared parity data decoding circuit 170 that is operable to decode shared parity codewords in accordance with one or more embodiments of the present invention. Data processing circuit 100 includes an analog front end circuit 110 that receives an analog signal 105. Analog front end circuit 110 processes analog signal 105 and provides a processed analog signal 112 to an analog to digital converter circuit 114. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog signal 105 is derived from a read/write head assembly (not shown) that is disposed in relation to a storage medium (not shown). In other cases, analog signal 105 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 105 may be derived.

Analog to digital converter circuit 114 converts processed analog signal 112 into a corresponding series of digital samples 116. Analog to digital converter circuit 114 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 116 are provided to an equalizer circuit 120. Equalizer circuit 120 applies an equalization algorithm to digital samples 116 to yield an equalized output 125. In some embodiments of the present invention, equalizer circuit 120 is a digital finite impulse response filter circuit as are known in the art. In some cases, equalizer 120 includes sufficient memory to maintain one or more codewords until a data detector circuit 130 is available for processing. It may be possible that equalized output 125 may be received directly from a storage device in, for example, a solid state storage system. In such cases, analog front end circuit 110, analog to digital converter circuit 114 and equalizer circuit 120 may be eliminated where the data is received as a digital data input.

Data detector circuit 130 is operable to apply a data detection algorithm to a received codeword or data set, and in some cases data detector circuit 130 can process two or more codewords in parallel. In some embodiments of the present invention, data detector circuit 130 is a Viterbi algorithm data detector circuit as are known in the art. In other embodiments of the present invention, data detector circuit 130 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 130 is started based upon availability of a data set from equalizer circuit 120 or from a central memory circuit 150.

Upon completion, data detector circuit 130 provides detector output 196. Detector output 196 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 196 is provided to a local interleaver circuit 142. Local interleaver circuit 142 is operable to shuffle sub-portions (i.e., local chunks) of the data set included as detected output and provides an interleaved codeword 146 that is stored to central memory circuit 150. Interleaver circuit 142 may be any circuit known in the art that is capable of shuffling data sets to yield a re-arranged data set. Interleaved codeword 146 is stored to central memory circuit 150. Interleaved codeword 146 is comprised of a number of encoded sub-codewords designed to reduce the complexity of a downstream data decoder circuit while maintaining reasonable processing ability. An example of such a codeword comprised of encoded sub-codewords is discussed in relation to FIG. 2.

Figure 2:
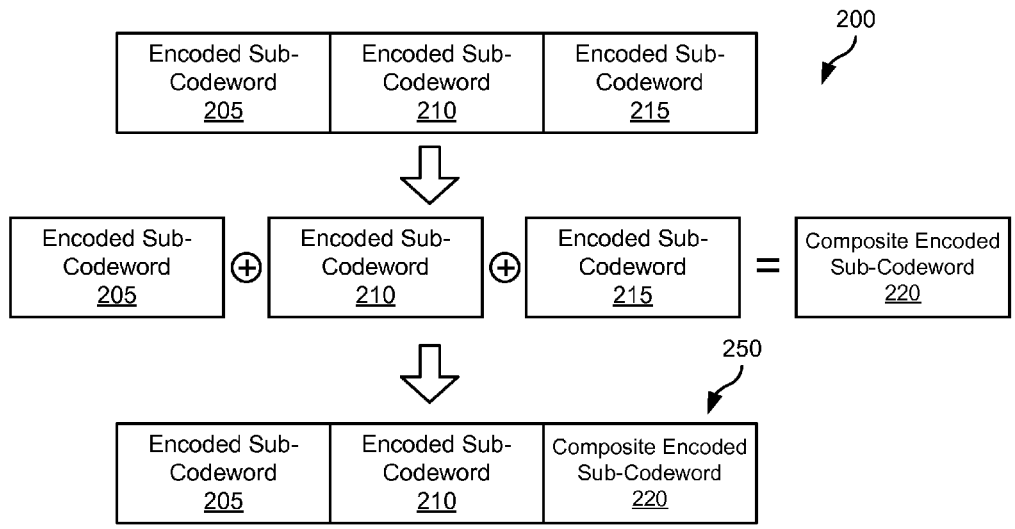
FIG. 2 graphically depicts a process for generating a shared parity codeword that may be used in relation to embodiments of the present invention.

Turning to FIG. 2, a graphical depiction 200 of a process for generating a shared parity codeword that may be used in relation to embodiments of the present invention. Graphical depiction 200 shows a 4 Kb codeword formed of a number of encoded sub-codewords 205, 210, 215. It should be noted that the codeword is merely an example, and that a codeword greater than or less than 4 Kb may be used and the codeword may be broken into more or fewer than the three shown encoded sub-codewords. In some cases, the encoded sub-codewords are encoded using low density parity check (LDPC) encoding as is known in the art.

Encoded sub-codewords 205, 210, 215 are each constructed by encoding a portion of user data such that each of sub-codewords include parity bits calculated during the encoding process that are calculated based upon the portion of user data represented by the respective sub-codeword. The parity check matrix, $$\begin{bmatrix} H1 \\ H2 \end{bmatrix},$$

may be designed such that $H2=\phi$, and sub-codeword 205 and sub-codeword 215 are the same code. Since sub-codeword 205 and sub-codeword 215 have a similar parity check matrix part as H1, the encoding of encoded sub-codeword 205, encoded sub-codeword 210, and encoded sub-codeword 215 can be simplified as portions of the circuitry can be shared. The encoding may not limit to this simple example (H1 and H2), but rather can be anything which can construct different correction power low density parity check codes as component codewords.

Prior to transferring encoded sub-codewords to a storage medium or via another transfer medium, encoded sub-codeword 205, encoded sub-codeword 210 and encoded sub-codeword 215 are mathematically combined to yield a composite encoded sub-codeword 220. In one particular embodiment of the present invention, the mathematical combination is a mod 2 operation. In such a case, encoded sub-codeword 205 is combined on an element by element basis using a mod 2 process to yield an interim codeword. The interim codeword is then combined on an element by element basis with encoded sub-codeword 215 using a mod 2 process to yield composite encoded sub-codeword 220. Of note, combining two or more encoded sub-codewords in such a way yields a valid encoded codeword that incorporates parity related to information from more than one encoded sub-codeword. Once the combining is completed, the encoded sub-codewords are combined to yield an overall codeword 250 where encoded sub-codeword 215 is replaced by composite encoded sub-codeword 220. Overall codeword 250 is then transferred to a storage medium or other transfer medium. Overall codeword 250 has the advantage that it may be processed on a sub-codeword basis, but because it includes composite encoded sub-codeword 220 with parity representing information from a number of encoded sub-codewords, increased processing performance is achievable when compared with encoded sub-codewords 205, 210, 215 being processed separately.

Returning to FIG. 1, once shared parity data decoding circuit 170 is available, a previously stored interleaved codeword 146 is accessed from central memory circuit 150 as a stored codeword 186 and globally interleaved by a global interleaver/de-interleaver circuit 184. Global interleaver/De-interleaver circuit 184 may be any circuit known in the art that is capable of globally rearranging codewords. Global interleaver/De-interleaver circuit 184 provides a decoder input 152. As described more fully below, decoder input 152 includes a number of sub-codewords that each include parity with at least one of the sub-codewords including parity that incorporates information from multiple sub-codewords. Each of the sub-codewords is provided to a respective one of a subset decoder circuit 162, a subset decoder circuit 164 and a subset decoder circuit 166 incorporated within shared parity data decoding circuit 170. Each of subset decoder circuit 162, subset decoder circuit 164 and subset decoder circuit 166 is operable to apply a data decode algorithm to the respective sub-codeword. Subset decoder circuit 162 provides a sub-decoded output 163; subset decoder circuit 164 provides a sub-decoded output 165; and subset decoder circuit 166 provides a sub-decoded output 167. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. It should be noted that while shared parity data decoding circuit 170 is shown with three separate subset decoder circuits 162, 164, 166, it is not required to have physically distinct subset decoder circuits. Rather, tie sharing can be used within a smaller number of decoder circuits to simplify circuit design and further reduce circuit area. For example, a single subset decoder circuit may be employed that: (1) processes encoded sub-codeword 205 by performing a partial codeword check to variable node update or variable node to check node during a first time slot, (3) processes encoded sub-codeword 210 by performing a partial codeword check to variable node update or variable node to check node during a second time slot, and (3) processes composite encoded sub-codeword 220 by performing a partial codeword check to variable node update or variable node to check node during a third time slot, and so on.

Each of subset decoder circuits 162, 164, 166 operates on a smaller codeword (e.g., one of encoded sub-codeword 205, encoded sub-codeword 210 or composite encoded sub-codeword 220) than it would be operating on if the respective circuit processed a unified codeword including all of the encoded sub-codewords. Because of this, the aggregate size and power requirements of subset decoder circuits 162, 164, 166 is less than what would be required if a unified codeword including all of the sub-codewords was processed by a single data decoding circuit. It should be noted that while FIG. 1 shows three subset decoder circuits, that more than or fewer than three subset decoder circuits may be used in relation to different embodiments of the present invention.

In particular, using the example of FIG. 2, subset decoder circuit 162 receives encoded sub-codeword 205, subset decoder circuit 164 receives encoded sub-codeword 210, and subset decoder circuit 166 receives composite encoded sub-codeword 220. Of note, each of encoded sub-codeword 205, encoded sub-codeword 210, and composite encoded sub-codeword 220 includes noise introduced from various sources and represented as E1 for encoded sub-codeword 205, E2 for encoded sub-codeword 210, and E3 for composite encoded sub-codeword 220. Each of subset decoder circuits 162, 164, 166 applies an LDPC decoding algorithm to the received encoded sub-codeword to yield sub-decoded output 163, sub-decoded output 165, and sub-decoded output 167, respectively.

Sub-decoded output 163, sub-decoded output 165, and sub-decoded output 167 are provided to a soft data processing circuit 175 included as part of shared parity data decoding circuit 170. Soft data processing circuit 175 is operable to assemble the various sub-decoded outputs and to determine whether the respective sub-decoded outputs converged (i.e., the resulting sub-decoded output matches the originally written data set as indicated by the lack of parity errors). Where all of the sub-decoded outputs converged, soft data processing circuit 175 assembles the sub-decoded outputs into an output codeword 172. Output codeword 172 is provided to a de-interleaver circuit 180. De-interleaver circuit 180 rearranges the data to reverse both the global and local interleaving applied to the data to yield a de-interleaved output 182. De-interleaved output 182 is provided to a hard decision output circuit 190. Hard decision output circuit 190 is operable to re-order data sets that may complete out of order back into their original order. The originally ordered data sets are then provided as a hard decision output 192.

Alternatively, where one or more of the sub-decoded outputs failed to converge, soft data processing circuit 175 uses the knowledge from other sub-decoded outputs to correct any remaining errors in a given sub-decoded output. For this processing, soft data processing circuit 175 may set the soft data for the converged encoded sub-codeword to high reliability values. Such high reliability values will be used to help other encoded sub-codeword decoding and speed up the convergence of other encoded sub-codewords.

As an example, where encoded sub-codeword 205 and encoded sub-codeword 210 can be properly decoded yielding sub-decoded output 163 and sub-decoded output 165 that converge, but composite sub-codeword 220 cannot be properly decoded such that sub-decoded output 167 does not converge, the process for generating composite sub-codeword 220 discussed above in relation to FIG. 2 may be reversed to generate a corrected encoded sub-codeword 215. This operation of reversing includes using the error equation:

encoded subcodeword 215=encoded subcodeword 205+encoded subcodeword 210+composite encoded subcodeword 220+$E3$ to generate encoded sub-codeword 215. Subset decoder circuit 166 can then decode the following information:

encoded subcodeword 215+E3

To recover the original encoded sub-codeword 215 that is provided as sub-decoded output 167 to soft data processing circuit 175 where, if sub-decoded output 167 converged, it can be combined with the other converged sub-decoded outputs to yield output codeword 172.

Alternatively, where any remaining errors are not correctable, soft data processing circuit 175 provides the respective portions of a given sub-decode output back to a corresponding subset decoder circuit for additional processing where another local iteration is allowed. Where another local iteration is not allowed, soft data processing circuit 175 writes the sub-decoded outputs as a decoded output 154 back to central memory circuit 150 where they are stored awaiting another global iteration through data detector circuit 130 and shared parity data decoding circuit 170. Prior to storage of decoded output 154 to central memory circuit 150, decoded output 154 is globally de-interleaved to yield a globally de-interleaved output 188 that is stored to central memory circuit 150. The global de-interleaving reverses the global interleaving earlier applied to stored codeword 186 to yield decoder input 152. Once data detector circuit 130 is available, a previously stored de-interleaved output 188 is accessed from central memory circuit 150 and locally de-interleaved by a de-interleaver circuit 144. De-interleaver circuit 144 re-arranges decoder output 148 to reverse the shuffling originally performed by interleaver circuit 142. A resulting de-interleaved output 197 is provided to data detector circuit 130 where it is used to guide subsequent detection of a corresponding data set receive as equalized output 125.

In some cases, the aforementioned processing by soft data processing circuit 175 may be performed on the soft data (i.e., log-likelihood ration (LLR) information) derived from data detector circuit 130. In such a case, using the example from above, the LLR information of reconstituted encoded sub-codeword 215 ($L'_{215}$) can be expressed based upon the corresponding LLR information from encoded sub-codeword 205 ($L_{205}$), encoded sub-codeword 210 ($L_{210}$), and composite encoded sub-codeword 220 ($L_{220}$) as follows:

$$L'^{(j)}_{215} = \frac{L^{(j)}_{205} + L^{(j)}_{210} + L^{(j)}_{220} + L^{(j)}_{205}L^{(j)}_{210}L^{(j)}_{220}}{1 + L^{(j)}_{205}L^{(j)}_{210} + L^{(j)}_{205}L^{(j)}_{220} + L^{(j)}_{215}L^{(j)}_{220}},$$

where j is the j-th bit of encoded sub-codeword 205, encoded sub-codeword 210, encoded sub-codeword 215, and composite encoded sub-codeword 220.

The LDPC decoding may be designed to use multiple local iterations (i.e., consecutive passes through subset decoder circuits 162, 164, 166). For each local iteration, the LLR information for the j-th bit of encoded sub-codeword 205 ($L_{205}$), encoded sub-codeword 210 ($L_{210}$), and composite encoded sub-codeword 220 ($L_{220}$) may be expressed as:

$$L^{(j)}_{205} = \frac{L^{(j)}_{210} + L^{(j)}_{220} + L^{(j)}_{215} + L^{(j)}_{210}L^{(j)}_{220}L'^{(j)}_{215}}{1 + L^{(j)}_{210}L^{(j)}_{220} + L^{(j)}_{210}L'^{(j)}_{215} + L^{(j)}_{220}L'^{(j)}_{215}},$$

$$L^{(j)}_{210} = \frac{L^{(j)}_{205} + L^{(j)}_{220} + L^{(j)}_{215} + L^{(j)}_{205}L^{(j)}_{220}L'^{(j)}_{215}}{1 + L^{(j)}_{205}L^{(j)}_{220} + L^{(j)}_{205}L'^{(j)}_{215} + L^{(j)}_{220}L'^{(j)}_{215}}, \text{ and}$$

$$L^{(j)}_{220} = \frac{L^{(j)}_{205} + L^{(j)}_{210} + L'^{(j)}_{215} + L^{(j)}_{210}L^{(j)}_{220}L'^{(j)}_{215}}{1 + L^{(j)}_{205}L^{(j)}_{210} + L^{(j)}_{205}L'^{(j)}_{215} + L^{(j)}_{210}L'^{(j)}_{215}}.$$

Figure 3:
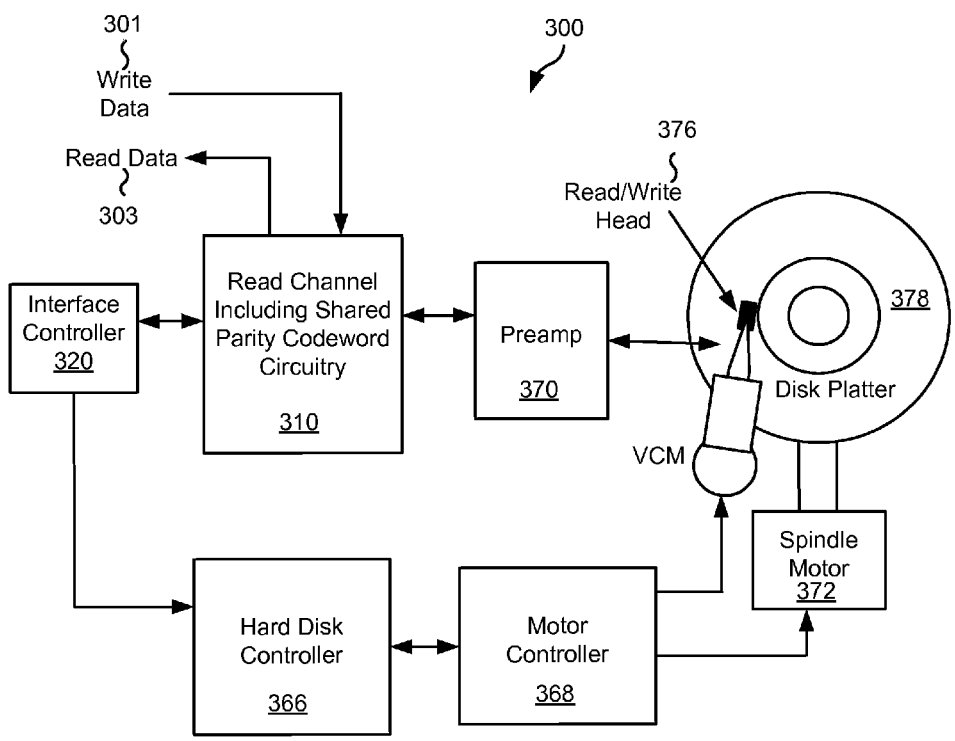
FIG. 3 shows a disk based storage device including a read channel having shared parity data decoding circuitry in accordance with one or more embodiments of the present invention.

Turning to FIG. 3, a disk based storage device 300 including a read channel circuit 310 having shared parity data decoding circuitry is shown in accordance with one or more embodiments of the present invention. Disk based storage system 300 may be, for example, a hard disk drive. Disk based storage system 300 also includes a preamplifier 370, an interface controller 320, a hard disk controller 366, a motor controller 368, a spindle motor 372, a disk platter 378, and a read/write head assembly 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

In a typical read operation, read/write head assembly 376 is accurately positioned by motor controller 368 over a desired data track on disk platter 378. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 378 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel circuit 310 via preamplifier 370. Preamplifier 370 is operable to amplify the minute analog signals accessed from disk platter 378. In turn, read channel circuit 310 decodes and digitizes the received analog signal to recreate the information originally written to disk platter 378. This data is provided as read data 303 to a receiving circuit. A write operation is substantially the opposite of the preceding read operation with write data 301 being provided to read channel circuit 310. This data is then encoded and written to disk platter 378.

During operation, data may be encoded prior to a write operation. The data encoding may be done such that a data set is encoded into multiple sub-codewords with parity in one or more of the sub-codewords being shared across a number of sub-codewords. Such encoding may be done using a circuit similar to that discussed below in relation to FIG. 7, and/or may perform the encoding using a method similar to that discussed below in relation to FIG. 8. Data read back from disk platter 378 may be decoded using a number of subset decoder circuits each operating on a respective sub-codeword. One or more of the sub-codewords may include parity that extends across multiple sub-codewords. Such sub-codeword decoding may be done using a circuit similar to that discussed above in relation to FIG. 1, and/or may be done similar to the method discussed below in relation to FIG. 6.

It should be noted that storage system may utilize SATA, SAS or other storage technologies known in the art. Also, it should be noted that storage system 300 may be integrated into a larger storage system such as, for example, a RAID (redundant array of inexpensive disks or redundant array of independent disks) based storage system. It should also be noted that various functions or blocks of storage system 400 may be implemented in either software or firmware, while other functions or blocks are implemented in hardware.

Figure 4:
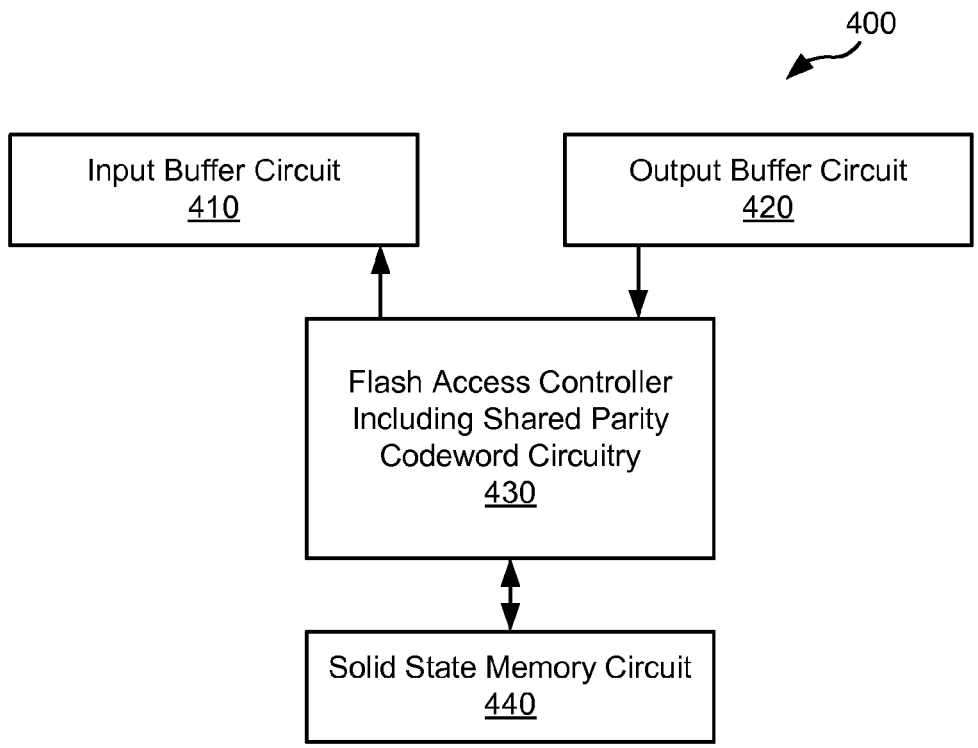
FIG. 4 shows a solid state storage device including a flash access controller having shared parity data decoding circuitry in accordance with one or more embodiments of the present invention.

Turning to FIG. 4, a solid state storage device 400 including a flash access controller 430 having shared parity data decoding circuitry in accordance with one or more embodiments of the present invention. Solid state storage device 400 includes a solid state memory circuit 440 that includes a number of memory cells. In one particular embodiment of the present invention, solid state memory circuit 440 includes a number of FLASH memory cells as are known in the art. Flash access controller 430 includes sub-codeword encoding circuitry operable to encode an overall codeword having a number of encoded sub-codewords with at least one of the encoded sub-codewords incorporating parity information from across two or more encoded sub-codewords. Such encoding circuitry may be implemented similar to that discussed below in relation to FIG. 7 and/or may operate similar to that discussed below in relation to FIG. 8. Further, flash access controller 430 includes sub-codeword decoding circuitry operable to decode an overall codeword having a number of encoded sub-codewords with at least one of the encoded sub-codewords incorporating parity information from across two or more encoded sub-codewords. Such decoding circuitry may be implemented similar to that discussed above in relation to FIG. 1 and/or may operate similar to that discussed below in relation to FIG. 6. Decoded data is provided from flash access controller 430 to an input buffer circuit 410 where it may be accessed by a host (not shown). In addition, data to be stored to solid state memory 440 is received from a host that writes the data to n output buffer circuit 420 that in turn provides the information to flash access controller 430.

Figure 5:
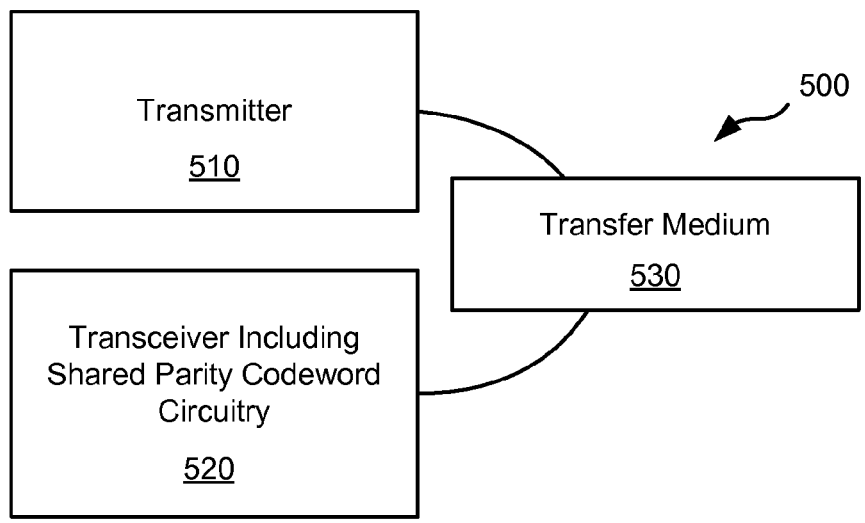
FIG. 5 shows a data transmission system including a receiver having shared parity data decoding circuitry in accordance with some embodiments of the present invention.

Turning to FIG. 5, a data transmission system 500 including a transceiver 520 having reliability data based tuning circuitry is shown in accordance with some embodiments of the present invention. Data transmission system 500 includes a transmitter 510 that is operable to transmit encoded information via a transfer medium 530 as is known in the art. The encoded data is received from transfer medium 530 by receiver 520. Transceiver 520 incorporates sub-codeword decoding and encoding circuitry. While processing received data, received data is converted from an analog signal to a series of corresponding digital samples, and the digital samples are equalized to yield an equalized output. The equalized output is then provided to a data processing circuit including both a data detector circuit and a data decoder circuit. Data is passed between the data decoder and data detector circuit via a central memory allowing for variation between the number of processing iterations that are applied to different data sets. It should be noted that transfer medium 530 may be any transfer medium known in the art including, but not limited to, a wireless medium, an optical medium, or a wired medium. Based upon the disclosure provided herein, one of ordinary skill in the art will recognize a variety of transfer mediums that may be used in relation to different embodiments of the present invention. Data may be encoded by transceiver 520 for transmission to another receiver circuit (not shown).

During operation, data may be encoded prior to a transmission operation by transceiver 520. The data encoding may be done such that a data set is encoded into multiple sub-codewords with parity in one or more of the sub-codewords being shared across a number of sub-codewords. Such encoding may be done using a circuit similar to that discussed below in relation to FIG. 7, and/or may perform the encoding using a method similar to that discussed below in relation to FIG. 8. Data received from transfer medium 530 may be decoded using a number of subset decoder circuits each operating on a respective sub-codeword. One or more of the sub-codewords may include parity that extends across multiple sub-codewords. Such sub-codeword decoding may be done using a circuit similar to that discussed above in relation to FIG. 1, and/or may be done similar to the method discussed below in relation to FIG. 6.

Figure 6:
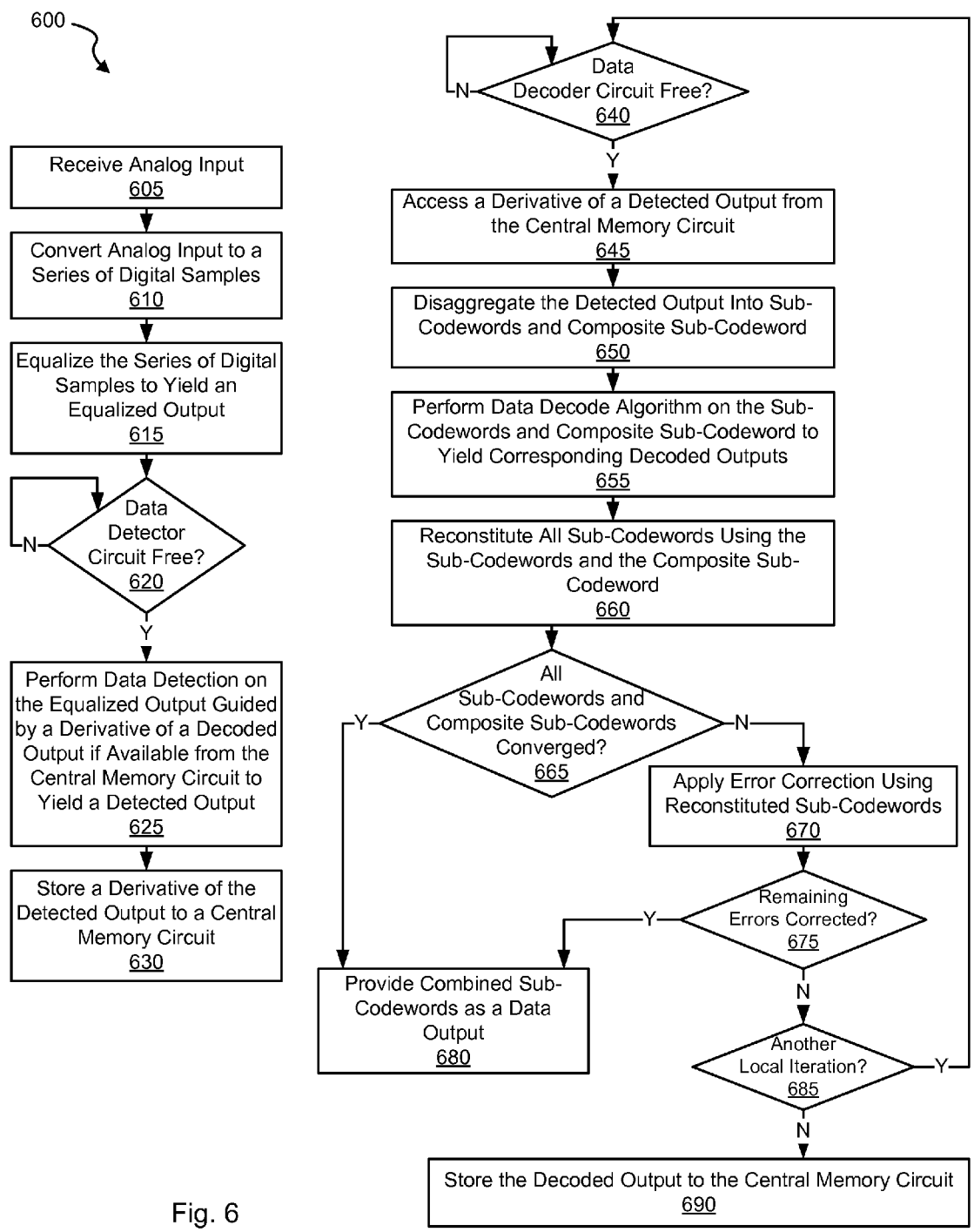
FIG. 6 is a flow diagram showing method for shared parity codeword processing in accordance with various embodiments of the present invention.

Turning to FIG. 6, a flow diagram 600 shows a method for shared parity codeword processing in accordance with various embodiments of the present invention. Following flow diagram 600, an analog input is received (block 605). The analog input may be derived from, for example, a storage medium or a data transmission channel. Based upon the disclosure provided herein, one of ordinary skill in the art will recognize a variety of sources of the analog input. The analog input is converted to a series of digital samples (block 610). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 615). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized output represents an overall codeword comprised of a number of encoded sub-codewords and at least one composite encoded sub-codeword similar to those discussed above in relation to FIG. 2. In some cases, the input may be received as a digital input. In such cases, the processes of blocks 605, 601, 615 may be eliminated.

It is determined whether a data detector circuit is available (block 620). Where a data detector circuit is available (block 620), a data detection algorithm is applied to the equalized output guided by a data set derived from a decoded output where available (e.g., the second and later iterations through the data detector circuit and the data decoder circuit) from a central memory circuit to yield a detected output (block 625). In some embodiments of the present invention, data detection algorithm is a Viterbi algorithm as are known in the art. In other embodiments of the present invention, the data detection algorithm is a maximum a posteriori data detector circuit as are known in the art. A signal derived from the detected output (e.g., a locally interleaved version of the detected output) is stored to the central memory to await processing by a data decoder circuit (block 630).

In parallel to the previously discussed data detection processing, it is determined whether a data decoder circuit is available (block 640). Where the data decoder circuit is available (block 640) a previously stored derivative of a detected output is accessed from the central memory (block 645). The accessed data set is disaggregated into one or more sub-codewords and one or more composite sub-codewords (block 650). This process may include, using the example of FIG. 2, separating overall codeword 250 into its component parts: encoded sub-codeword 205, encoded sub-codeword 210, and composite encoded sub-codeword 220. A data decoding algorithm is performed on each of the respective sub-codeword(s) and composite encoded sub-codeword(s) to yield corresponding decoded outputs (block 655). In some cases, the data decode algorithm is a low density parity check algorithm as are known in the art.

The original sub-codewords are reconstituted by reversing the mathematic process applied to the original sub-codeword(s) and composite sub-codeword(s) using decoded outputs (block 660). Where, for example, the mathematic process for creating the composite sub-codeword is that described above in relation to FIG. 2, reconstituting the original sub-codewords may be done using the following equations where $L_{205}$ is soft data from a decoded output corresponding to encoded sub-codeword 205, $L_{210}$ is soft data from a decoded output corresponding to encoded sub-codeword 210, and $L_{220}$ is soft data from a decoded output corresponding to composite encoded sub-codeword 220:

$$L'^{(j)}_{215} = \frac{L^{(j)}_{205} + L^{(j)}_{210} + L^{(j)}_{220} + L^{(j)}_{205}L^{(j)}_{210}L^{(j)}_{220}}{1 + L^{(j)}_{205}L^{(j)}_{210} + L^{(j)}_{205}L^{(j)}_{220} + L^{(j)}_{215}L^{(j)}_{220}},$$

where j is the j-th bit of encoded sub-codeword 205, encoded sub-codeword 210, encoded sub-codeword 215, and composite encoded sub-codeword 220; and $L'_{215}$ is the soft data corresponding to the reconstituted encoded sub-codeword 215.

It is determined whether each of the decoded outputs converged (i.e., whether the decode algorithm applied to each of the sub-codeword(s) and composite sub-codeword(s) converged)(block 665). Where all of the decoded outputs converged (block 665), the hard decision data associated with the decoded outputs is assembled together and provided as a data output (block 680). Otherwise, where all of the decoded outputs did not converge (block 665), additional error correction is applied using the sub-codeword(s), composite sub-codeword(s), and reconstituted sub-codeword(s) to correct any errors remaining in one or more otherwise non-converged sub-codeword(s)(block 670). The error correction utilizes the equations corresponding to the mathematical process originally applied to generate the composite sub-codeword. Using the example of FIG. 2, the equations are as follow:

$$L^{(j)}_{205} = \frac{L^{(j)}_{210} + L^{(j)}_{220} + L^{(j)}_{215} + L^{(j)}_{210}L^{(j)}_{220}L'^{(j)}_{215}}{1 + L^{(j)}_{210}L^{(j)}_{220} + L^{(j)}_{210}L'^{(j)}_{215} + L^{(j)}_{220}L'^{(j)}_{215}},$$

$$L^{(j)}_{210} = \frac{L^{(j)}_{205} + L^{(j)}_{220} + L^{(j)}_{215} + L^{(j)}_{205}L^{(j)}_{220}L'^{(j)}_{215}}{1 + L^{(j)}_{205}L^{(j)}_{220} + L^{(j)}_{205}L'^{(j)}_{215} + L^{(j)}_{220}L'^{(j)}_{215}}, \text{ and}$$

$$L_{220}^{(j)} = \frac{L_{205}^{(j)} + L_{210}^{(j)} + L_{215}^{'(j)} + L_{210}^{(j)}L_{220}^{(j)}L_{215}^{'(j)}}{1 + L_{205}^{(j)}L_{210}^{(j)} + L_{205}^{(j)}L_{215}^{'(j)} + L_{210}^{(j)}L_{215}^{'(j)}}.$$

It is determined whether all remaining errors have been corrected (block 675). Where all remaining errors have been corrected (block 675), the hard decision data associated with the decoded outputs is assembled together and provided as a data output (block 680). Otherwise, it is determined if another local iteration is expected (block 685). Where another local iteration is expected (block 685), the decoded outputs (block 655) are processed again through the processes of blocks 640-685. Alternatively, where another local iteration is not expected (block 685), the decoded outputs (block 655) are stored back to the central memory to await another global iteration through the processes of blocks 620-685 (block 690).

Figure 7:
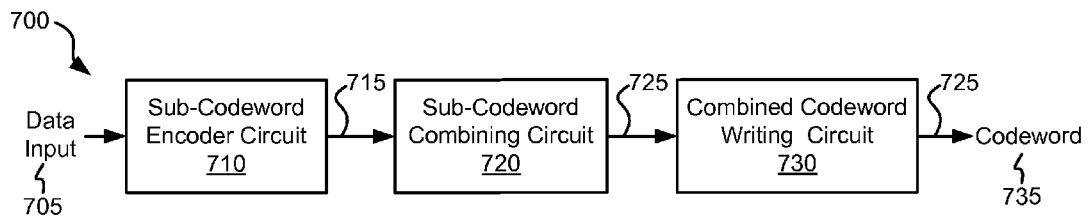
FIG. 7 depicts a shared parity codeword encoding circuit in accordance with some embodiments of the present invention.

Turning to FIG. 7, a shared parity codeword encoding circuit 700 is depicted in accordance with some embodiments of the present invention. Shared parity codeword encoding circuit 700 includes a sub-codeword encoder circuit 710 that receives a data input 705. Data input 705 is provided from a host (not shown) that is writing data to a storage medium or transferring data via a transfer medium. Data input 705 is separated by sub-codeword encoder circuit 710 into portions, and sub-codeword encoder circuit 710 applies a data encoding algorithm to the respective portions to yield a number of encode sub-codewords 715. In some embodiments of the present invention, the data encoding algorithm is a low density parity check encoding algorithm as are known in the art. The encoding algorithm adds parity information to the encoded sub-codeword based upon the respective portion of data input 705. Encoded sub-codewords 715 are provided to a sub-codeword combining circuit 720 where two or more encoded sub-codewords 715 are mathematically combined to yield a composite encoded sub-codeword. Sub-codeword combining circuit 720 assembles the encoded sub-codewords 715 with the composite encoded sub-codeword replacing one of the encoded sub-codewords to yield an overall codeword 725. The mathematical generation of the composite encoded sub-codeword may use a mod 2 combination of multiple encoded sub codewords to yield the composite encoded sub-codeword, and the subsequent combining of encoded sub-codewords and the composite encoded sub-codeword maybe done similar to that described above in relation to FIG. 2. Overall codeword 725 is provided to a combined codeword writing circuit 730 that performs any remaining operations in preparation for sending a codeword 735 to a storage medium or a receiving device.

Figure 8:
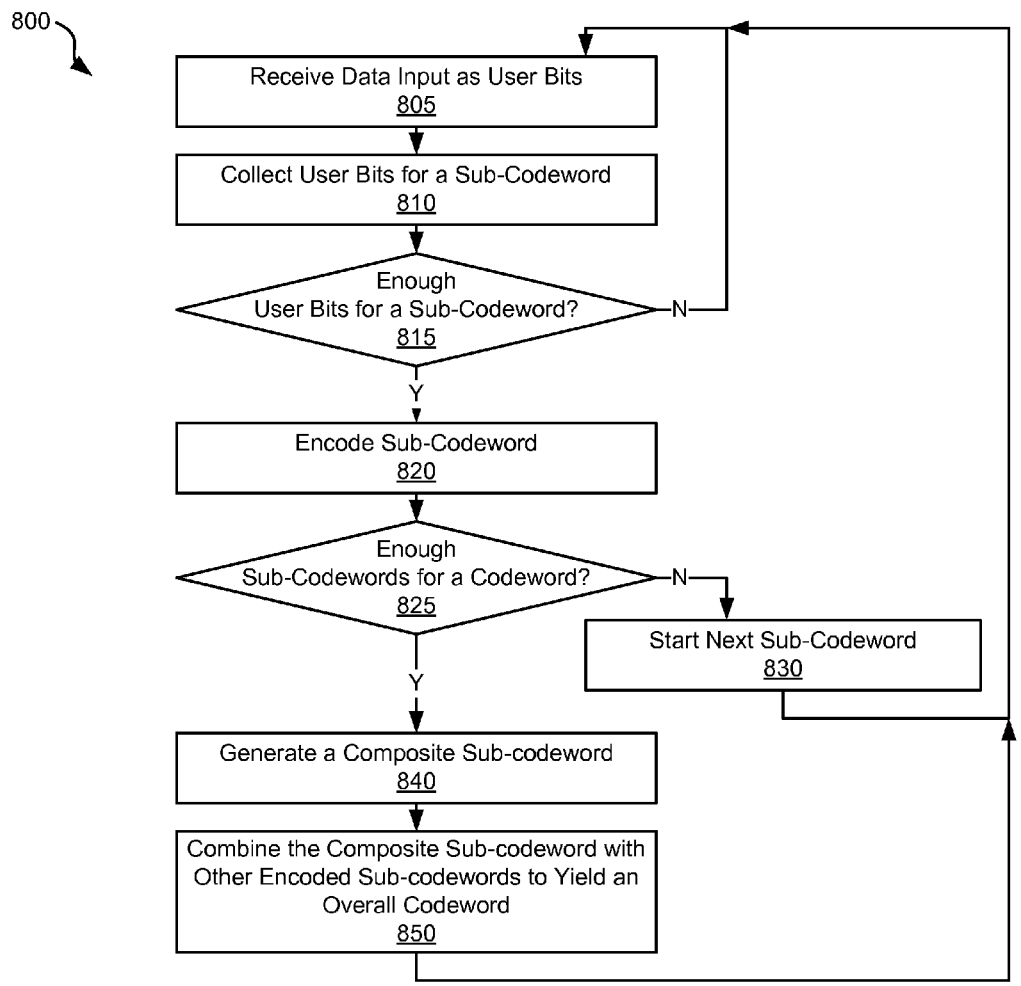
FIG. 8 is a flow diagram showing method for encoding shared parity codewords in accordance with one or more embodiments of the present invention.

Turning to FIG. 8, a flow diagram 800 shows a method for encoding shared parity codewords in accordance with one or more embodiments of the present invention. Following flow diagram 800, a data input is received (block 805). The data input includes user bits and may be received, for example, from a host. A number of the user bits are collected for inclusion in a sub-codeword (block 810). In some cases, the number of bits is pre-defined. In other cases, the number of bits is programmable. It is determined whether enough user bits have been received to form a sub-codeword (block 815). Where an insufficient number of user bits have been collected (block 815), the processes of blocks 805-815 are repeated. Alternatively, where a sufficient number of user bits have been collected (block 815), the collected user bits are encoded to yield an encoded sub-codeword (block 820). In some embodiments of the present invention, the data encoding is a low density parity check encoding as are known in the art. The encoding algorithm adds parity information to the collected user bits to yield an encoded sub-codeword.

It is determined whether enough sub-codewords have been encoded to create an overall codeword (block 825). Where an insufficient sub-codewords have been encoded (block 825), the next sub-codeword is prepared (block 830) by repeating the processes of blocks 805-825 until sufficient sub-codewords have been prepared. Otherwise, where sufficient sub-codewords have been encoded (block 815), a composite codeword is generated (block 840). Generating the composite codeword includes mathematically combining a number of encoded sub-codewords to yield the composite sub-codeword. In some cases, the mathematical process for combining is a mod 2 combination of two or more encoded sub-codewords. The encoded sub-codewords are combined with the composite sub-codeword to yield an overall codeword (block 850). The combining process includes replacing one of the encoded sub-codewords with the composite sub-codeword. The mathematical generation of the composite encoded sub-codeword, and the subsequent combining of encoded sub-codewords and the composite encoded sub-codeword maybe done similar to that described above in relation to FIG. 2.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a data detector circuit operable to apply a data detection algorithm to a data set to yield a detected output, wherein the data set includes at least a first encoded sub-codeword and a composite sub-codeword;
   a data decoder circuit operable to apply a data decode algorithm to the first encoded sub-codeword to yield a first decoded output, and to apply the data decode algorithm to the composite sub-codeword independent of the first encoded sub-codeword to yield a second decoded output; and a processing circuit operable to:
reconstitute a second encoded sub-codeword from a combination of data including the first encoded sub-codeword and the composite sub-codeword; and
correct an error in one of the first encoded sub-codeword and the second encoded sub-codeword based at least in part on a combination of the first encoded sub-codeword, the second encoded sub-codeword, and the composite sub-codeword.

2. The data processing system of claim 1, wherein the composite codeword is a mathematical combination of at least the first encoded sub-codeword and the second encoded sub-codeword.

3. The data processing system of claim 2, wherein reconstituting the second encoded sub-codeword from the combination of data including the first encoded sub-codeword and the composite sub-codeword includes reversing the mathematical combination of at least the first encoded sub-codeword and the second encoded sub-codeword.

4. The data processing system of claim 3, wherein correcting the error in one of the first encoded sub-codeword and the second encoded sub-codeword based at least in part on a combination of the first encoded sub-codeword, the second encoded sub-codeword, and the composite sub-codeword comprises:
modifying an element of one of the first encoded sub-codeword and the second encoded sub-codeword such that the mathematical combination of at least the first encoded sub-codeword and the second encoded sub-codeword yields a correct mathematical relationship.

5. The data processing system of claim 1, wherein the composite codeword is a mod 2 combination of at least the first encoded sub-codeword and the second encoded sub-codeword.

6. The data processing system of claim 1, wherein the data detection algorithm is selected from a group consisting of: a maximum a posteriori data detection algorithm and a Viterbi detection algorithm.

7. The data processing system of claim 1, wherein the data decode algorithm is a low density parity check algorithm.

8. The data processing system of claim 1, wherein the data decoder circuit comprises:
a first decode circuit operable to apply the data decode algorithm to the encoded sub-codeword to yield the first decoded output, and
a second decode circuit operable to apply the data decode algorithm to the composite sub-codeword to yield the second decoded output.

9. The data processing system of claim 1, wherein the low density parity check data decoder circuit comprises:
a decode circuit operable to:
apply the data decode algorithm to the encoded sub-codeword to yield the first decoded output during a first time period, and
apply the data decode algorithm to the composite sub-codeword to yield the second decoded output during a second time period.

10. The data processing circuit of claim 1, wherein the data processing system is implemented as part of a device selected from a group consisting of: a disk based storage device, a solid state storage device, and a receiving device.

11. The data processing system of claim 1, wherein the data processing system is implemented as part of an integrated circuit.

12. A method for data processing, the method comprising:
performing a data detection algorithm using a data detector circuit on a first data set to yield a detected output, wherein the data set includes at least a first encoded sub-codeword and a composite sub-codeword;
performing a data decode algorithm on a second data set derived from the detected output to yield a first decoded output corresponding to the first encoded sub-codeword;
performing the data decode algorithm on a third data set derived from the detected output independent of the first decoded output to yield a second decoded output corresponding to the composite sub-codeword;
reconstituting a second encoded sub-codeword from a combination of data including the second decoded output and the first decoded output; and
correcting an error in one of the first decoded output and the second decoded output based at least in part on a combination of the first encoded sub-codeword, the second encoded sub-codeword, and the composite sub-codeword.

13. The method of claim 12, wherein the composite codeword is a mathematical combination of at least the first encoded sub-codeword and the second encoded sub-codeword.

14. The method of claim 13, wherein reconstituting the second encoded sub-codeword from the combination of data including the second decoded output and the first decoded output comprises:
reversing the mathematical combination of at least the first encoded sub-codeword and the second encoded sub-codeword.

15. The method of claim 14, wherein correcting the error in one of the first decoded output and the second decoded output based at least in part on the combination of the first encoded sub-codeword, the second encoded sub-codeword, and the composite sub-codeword comprises:
modifying an element of one of the first encoded sub-codeword and the second encoded sub-codeword such that the mathematical combination of at least the first encoded sub-codeword and the second encoded sub-codeword yields a correct mathematical relationship.

16. The method of claim 12, wherein the composite codeword is a mod 2 combination of at least the first encoded sub-codeword and the second encoded sub-codeword.

17. The method of claim 12, wherein performing the data decode algorithm on the second data set is done in parallel to performing the data decode algorithm on the third data set.

18. The method of claim 12, wherein performing the data decode algorithm on the second data set is done during a first period, wherein performing the data decode algorithm on the third data set is done during a second period, and wherein the second period is subsequent to the first period.

19. A storage device, the storage device comprising:
a storage medium;
a head assembly disposed in relation to the storage medium and operable to provide a sensed signal corresponding to information on the storage medium;
a read channel circuit including:
an analog to digital converter circuit operable to sample an analog signal derived from the sensed signal to yield a series of digital samples;
an equalizer circuit operable to equalize the digital samples to yield a data set;
a data detector circuit operable to apply a data detection algorithm to the data set to yield a detected output, wherein the data set includes at least a first encoded sub-codeword and a composite sub-codeword;
a low density parity check data decoder circuit operable to apply a data decode algorithm to the encoded sub-codeword to yield a first decoded output, and to apply the data decode algorithm to the composite sub-codeword independent of the first encoded sub-codeword to yield a second decoded output; and a processing circuit operable to:
reconstitute a second encoded sub-codeword from a combination of data including the first encoded sub-codeword and the composite sub-codeword; and correct an error in one of the first encoded sub-codeword and the second encoded sub-codeword based at least in part on a combination of the first encoded sub-codeword, the second encoded sub-codeword, and the composite sub-codeword.

20. The data processing system of claim 19, wherein the composite codeword is a mathematical combination of at least the first encoded sub-codeword and the second encoded sub-codeword.

* * * * *